(12) United States Patent
Bannai (10) Patent No.: US 6,259,247 B1
(45) Date of Patent: Jul. 10, 2001

(54) METHOD OF TRANSFERRING IC DEVICES ON TEST HANDLER

(75) Inventor: Kuniaki Bannai, Oosato-mura (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/669,011

(22) Filed: Sep. 25, 2000

Related U.S. Application Data (63) Continuation of application No. 08/965,298, filed on Nov. 6, 1997.

(30) Foreign Application Priority Data

Nov. 18, 1996 (JP) .................................................. 8-306077

(51) Int. Cl.[7] .............................. G01R 1/04; G01R 31/02; B65B 21/02
(52) U.S. Cl. ........................ 324/158.1; 324/754; 414/403
(58) Field of Search ................................ 324/158.1, 754, 324/758, 765; 414/403, 416

(56) References Cited

U.S. PATENT DOCUMENTS

| | | | |
|---|---|---|---|
| 5,355,081 | * 10/1994 | Nakata et al. | 324/765 |
| 5,404,111 | * 4/1995 | Mori et al. | 324/758 |
| 5,546,405 | * 8/1996 | Golla | 324/754 |
| 5,631,573 | * 5/1997 | Ohno | 324/754 |
| 5,644,245 | * 7/1997 | Saitoh et al. | 324/754 |
| 5,900,737 | * 5/1999 | Graham et al. | 324/758 |
| 6,184,675 | * 2/2001 | Bannai | 324/158.1 |

* cited by examiner

Primary Examiner—Safet Metjahic
Assistant Examiner—Jermele M. Hollington (74) Attorney, Agent, or Firm—Muramatsu & Associates (57) ABSTRACT

A method of transferring IC devices with use of a horizontal transfer test handler in horizontal directions to and from a test head wherein the test handler includes a device tray for carrying a plurality of IC devices to be tested, an IC socket mounted on the test head to interface between the IC device under test and an IC tester by establishing electrical connections therebetween, and a reference position marker provided on an upper surface of the test handler. The method includes the steps of supplying input data regarding types of IC devices to be tested and data regarding device trays to carry the IC devices to be tested to the test handler, moving a device transfer mechanism for picking, transferring, and placing the IC devices in horizontal and vertical directions on the horizontal surface of the test handler wherein the device transfer mechanism has a video data acquisition means, acquiring video data indicating an image shown at each location on the upper surface of the test handler through the video data acquisition means by changing positions over the horizontal surface in accordance with the movement of the device transfer mechanism, processing video data on the horizontal surface of the test handler including said IC socket and performing a positional calibration process by comparing data representing a center of the IC socket and said reference position marker to produce a correction factor, processing the video data to determine a size of the device tray represented and judging whether the size of the IC tray matches tray size data in the input data, processing the video data to determine whether the IC socket on the horizontal surface of the test handler matches the IC device type data, correcting a center position of the IC device under test by changing a position of the device transfer mechanism based on the correction factor, and moving the device transfer mechanism between the device tray and the IC socket for picking, transferring, and placing the IC devices in horizontal and vertical directions on the horizontal surface of the test handler for testing the IC devices.

9 Claims, 8 Drawing Sheets

METHOD OF TRANSFERRING IC DEVICES ON TEST HANDLER

This is a continuation of U.S. application Ser. No. 08/965,298 filed Nov. 6, 1997.

FIELD OF THE INVENTION

This invention relates to a horizontal transfer test handler for transferring IC devices to and from a test head of an IC tester, and more particularly, to a method of transferring IC devices with use of a horizontal transfer test handler that automatically recognizes types and positions of IC devices, existence of the IC devices, types of device trays, and the like, through a video data acquisition means.

BACKGROUND OF THE INVENTION

Test handlers are frequently used for testing IC devices in combination with IC testers for automatically transferring IC devices to and from test heads of the IC testers. Test handlers are classified into two types, a vertical transfer type in which IC devices are transferred from the higher positions to the lower positions by their own gravity, and a horizontal transfer type in which IC devices are transferred along the horizontal surface of the test handler. This invention is directed to the horizontal transfer type test handler.

In a horizontal transfer test handler, a plurality of IC devices to be tested are provided on a device tray and horizontally transferred to a test head of an IC tester. Various test signals are supplied to the IC devices at the test head, and the resultant output signals from the IC devices are evaluated by the IC tester. The tested IC devices are classified based on the test results and transferred to the corresponding device trays.

Figure 6:
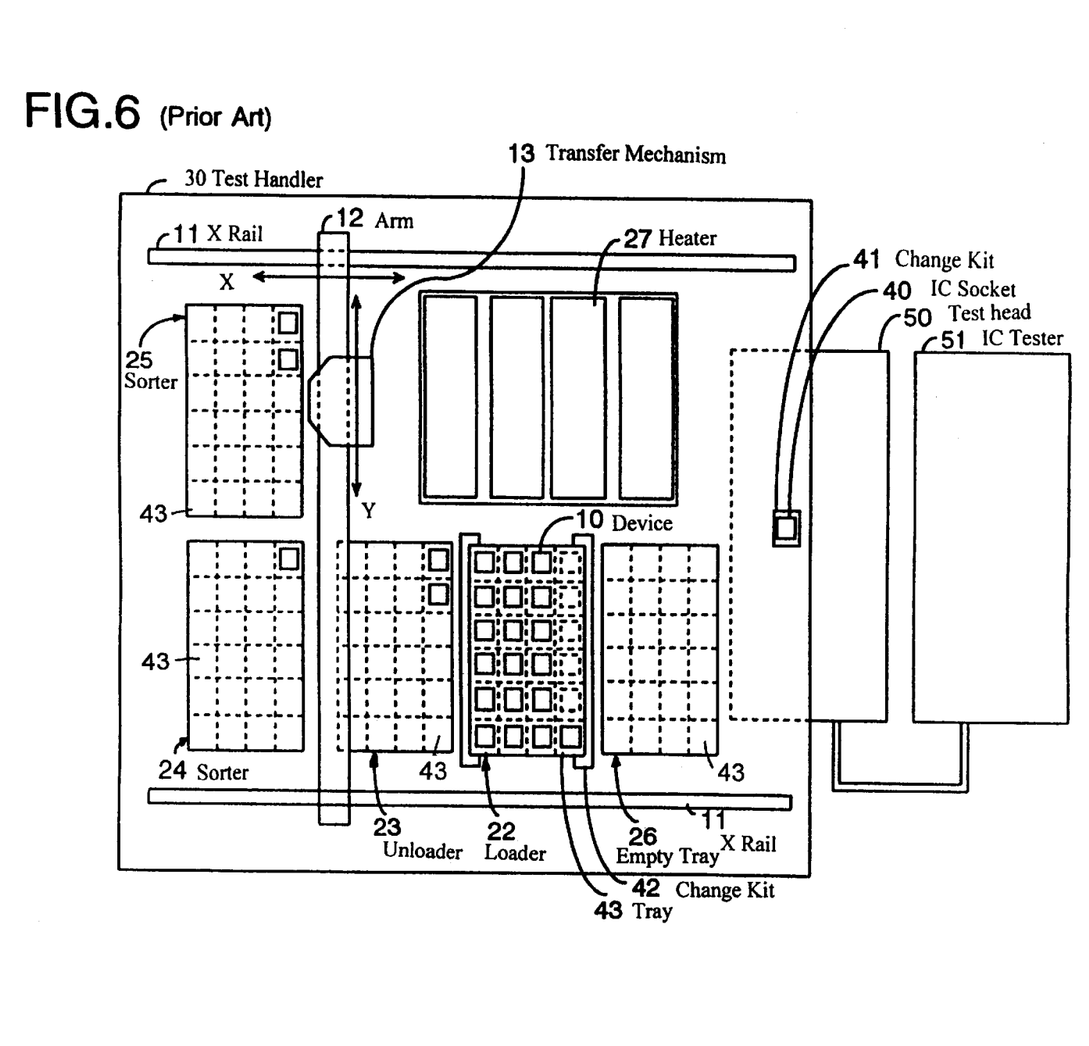
FIG. 6 is a plan view showing horizontal transfer test handler of the conventional technology in combination with the IC tester and the test head.
Figure 7:
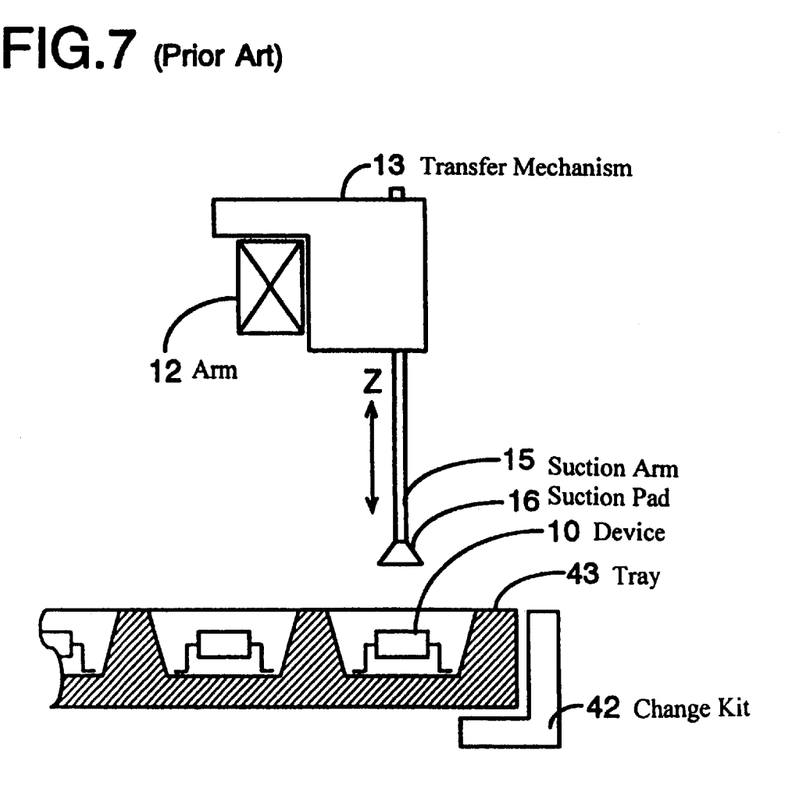
FIG. 7 is a schematic diagram showing a side view of the device transfer mechanism and a cross sectional view of the device tray in the conventional technology.
Figure 8:
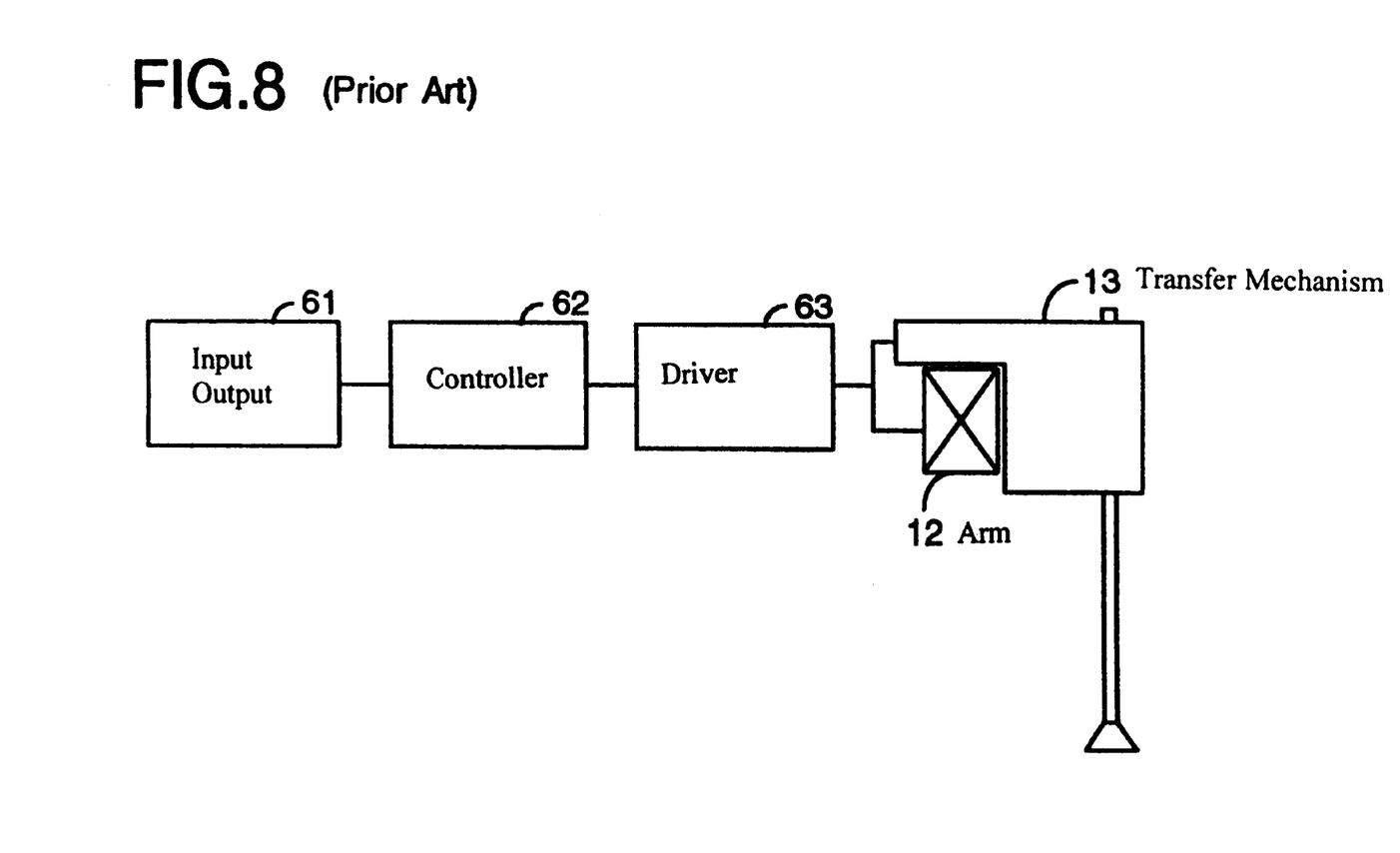
FIG. 8 is a schematic diagram showing a control section of the horizontal transfer test handler in the conventional technology.

An example of horizontal transfer test handler in the conventional technology is shown in FIGS. 6–8. A horizontal transfer test handler is a robot mechanism that transfers IC devices in horizontal directions, places the IC devices on the test head of the IC tester, receives the IC devices that have been tested, and sorts the IC devices on the device trays on the basis of the test results.

As shown in FIG. 6, the horizontal transfer test handler 30 in the prior art is comprised of a device transfer mechanism 13 to pick, transfer, and place the IC devices, a mobile arm 12 to allow movements of the device transfer mechanism 13 in a Y direction, an X direction rail to allow movements of the mobile arm 12 in an X direction, a loader area 22 for loading a device tray 43 having a plurality of IC devices to be tested, an unloader area 23 for receiving the IC devices that have passed the test on a device tray 43, sorter areas 24 and 25 for sorting the tested IC devices that have failed in the test on respective device trays 43, a heater area 27 for applying heat to the IC devices to be tested so that the IC devices are tested under a high temperature environment, an empty tray area 26 for placing a device tray 43 emptied in the loader area 22, and change kits 41 and 42 for accommodating different sizes and types of device trays and IC sockets.

As shown in FIG. 7, the device transfer mechanism 13 is comprised of a suction pad 16 that performs suction (pick operation) and suction release (place operation) processes for IC devices 10 stored on a device tray 43. The suction force is created, for example, by a vacuum pressure. A suction arm 15 allows movements of the suction pad 16 in a Z (up-down) direction.

In FIG. 6, the horizontal transfer test handler 30 is connected to a test head 50 that is electrically connected to an IC tester 51. The test head 50 has an IC socket 40 that acts as an interface between the IC device 10 under test and the test head 50. The IC socket 40 mounted on the test head 50 transmits electric signals from each of its contact terminals to a corresponding device pin during the test of the IC device 10.

The change kits are groups of mechanical parts for adjusting the test handler 30 to various types and sizes of IC devices and the device trays by replacing all or portions of the mechanical parts. The kind of the change kit includes a change kit 42 that supports the device tray 43 of different sizes and types. The device tray 43 is mounted on the loader area 22 while being adjusted its position by the change kit 42. The change kit 41 performs an accurate mechanical positioning for the IC socket on the test head 50. Thus, the change kit 41 adjusts the position of the IC socket 40 relative to the test head 50 in response to the size and types of the IC devices to be tested.

FIG. 8 is a schematic diagram showing a control section of the horizontal transfer test handler. The control section is comprised of an input/output means 61 for receiving a control program and input data and generating test information or other test results, a controller 62 that interprets and executes the control program and input data, a device transfer mechanism driver 63 controlled by the controller 62. Based on the drive signals from the driver 63, the device transfer mechanism 13 is moved in the X, Y, and Z directions. Namely, a pulse motor (not shown) is controlled to drive the suction arm 15 in the Z direction. The mobile arm 12 is driven in the X direction while the device transfer mechanism 13 is driven in the Y direction, respectively, by the drive signals from the driver 63.

Referring back to FIG. 6, the horizontal transfer test handler 30 transfers the IC device 10 in a horizontal direction, and presses the lead pins of the IC device 10 to the contact terminals of the IC socket 40 mounted on the test head 50. Test signals are applied to the IC device from the IC tester through the IC socket 40. The resultant signals from the IC device 10 are transmitted to the IC tester through the IC socket 40 and evaluated by comparing the resultant signals with expected data. The IC tester determines pass or fail of the IC devices 10. The horizontal transfer test handler 30 sorts the tested IC devices 10 according to the test results.

The IC devices 10 to be tested by such a system of the test handler and IC tester are IC, LSI circuits and VLSI circuits. Even when the functions are identical, IC devices are put in different type and size of packages to meet the needs in the market. For example, the kinds of packages include SOP (Small Outline Package), QFP (Quad Flat Package), BGA (Ball Grid Array Package), and so on. The number of pins of the IC devices to be connected to outside electrodes also extends to a wide range, such as from a few pins to several hundred pins. The distance between the two adjacent pins of the IC devices, i.e., a pin pitch, is very small, such as from 0.25 mm to 0.8 mm.

The device tray 43 stores IC devices 10 in its hole-like seats where each of the IC devices is positioned by tapered walls of the seat. For example, the device tray 43 shown in FIG. 6 can store 24 (4×6=24) devices. The size of the device tray varies, for instance, from 100 mm to 140 mm in width, and from 206 mm to 330 mm in length.

The operation and function of the horizontal transfer test handler 30 is explained in the following.

Prior to the start of the test, the IC devices 10 to be tested are stored in the device tray 43 which is loaded on the loader area 22 of the test handler 30. Test programs and necessary data for testing the IC devices 10 are installed in the test handler 30 through the input/output means 61. The necessary data for the test includes the information on the kinds of IC devices 10 to be tested, the package types of the IC devices 10, the number of device pins, and the size of the device tray 43.

The suction arm 15 moves in the Z direction and the suction pad 16 performs the suction process on the IC devices 10 stored in the device tray 43. While sucking the IC device 10 at the tip of the suction pad 16, the mobile arm 12 and the device transfer mechanism 13 move in the X and Y directions to the heater area 27 to place the IC device 10 thereon so that the IC device is provided with heat. Then the IC device 10 heated in the heater area 27 is again picked up by the suction pad 16 and moved to the IC socket 40 on the test head 50 to connect the lead pins of the IC device 10 to the contact terminals of the IC socket 40.

When the IC device is connected to the IC socket 40, the test of the IC device 10 is carried out by the IC tester. After the test, the device transfer mechanism 13 transfers the IC devices that have been tested to several areas based on the test results. Good IC devices are transferred to a device tray 43 on the unloader area 23 while the defective IC devices are transferred to device trays 43 on the sort areas 24 and 25 to be classified based on types of defect.

When the device tray 43 in the loader area 22 is emptied because all of the IC devices 10 are removed therefrom for the test, the device tray 43 is transferred to the empty tray area 26. The above noted process is repeated for the IC devices on the next device tray 43 mounted on the loader area 23 of the test handler 30.

As explained above, there are a variety of packages of the IC devices 10 to be handled by the test handler 30. Accordingly, the device trays 43 come with various types corresponding to the types of the packages. An operator of the test handler 30 has to provide the data through the input/output means 61 indicating the types of the packages and trays. As a consequence, errors may be involved in such a data input process because the types of packages and trays are rather complicated.

Moreover, since the pin pitch of the IC devices is very small, accurate mechanical positioning is necessary for establishing the electrical connection between the lead pins of IC device to be tested and the contact terminals of the IC socket 40. To improve the mechanical positioning, a gap between the taper wall of the device tray 43 and the IC device 10 may be decreased. However, such a solution may cause a further problem such as jamming because of the decreased play in the device tray. Further, the change kits 41 and 42 will be required to have a higher level of mechanical finishing to more accurately positioning the IC socket 40 and the device trays 43.

SUMMARY OF THE INVENTION

Therefore, it is an object of the present invention to provide a method of transferring IC devices with use of a horizontal transfer test handler which is capable of improving reliability and operability by automatically positioning the change kits when the types of IC devices to be tested are to be exchanged.

It is another object of the present invention to provide a horizontal transfer test handler which has a video data input means and a reference position marker to automatically position the device trays and IC sockets to avoid human errors involved in testing various types of IC devices.

It is a further object of the present invention to provide a horizontal transfer test handler which is capable of accurately connecting the lead pins of the IC device to the corresponding contact terminals of the IC socket.

It is a further object of the present invention to provide a horizontal transfer test handler which is capable of testing the IC devices with high efficiency and accuracy.

The method of the present invention for transferring IC devices with use of a horizontal transfer test handler in horizontal directions to and from a test head wherein the test handler includes a device tray for carrying a plurality of IC devices to be tested, an IC socket mounted on the test head to interface between the IC device under test and an IC tester by establishing electrical connections therebetween, and a reference position marker provided on an upper surface of the test handler. The method includes the steps of supplying input data regarding types of IC devices to be tested and data regarding device trays to carry the IC devices to be tested to the test handler, moving a device transfer mechanism for picking, transferring, and placing the IC devices in horizontal and vertical directions on the horizontal surface of the test handler wherein the device transfer mechanism has a video data acquisition means, acquiring video data indicating an image shown at each location on the upper surface of the test handler through the video data acquisition means by changing positions over the horizontal surface in accordance with the movement of the device transfer mechanism, processing video data on the horizontal surface of the test handler including said IC socket and performing a positional calibration process by comparing data representing a center of the IC socket and said reference position marker to produce a correction factor, processing the video data to determine a size of the device tray represented and judging whether the size of the IC tray matches tray size data in the input data, processing the video data to determine whether the IC socket on the horizontal surface of the test handler matches the IC device type data, correcting a center position of the IC device under test by changing a position of the device transfer mechanism based on the correction factor, and moving the device transfer mechanism between the device tray and the IC socket for picking, transferring, and placing the IC devices in horizontal and vertical directions on the horizontal surface of the test handler for testing the IC devices.

The video data acquisition means is formed with a CCD camera to obtain information on a type of IC device under test, existence of the IC device on the device tray, a type of device tray, a type of the IC socket, and the positions of the IC device and IC socket, and the like.

The horizontal transfer test handler further includes a control section to control an overall operation of the test handler. The control section includes an input/output means for interfacing between an operator and the test handler, a video data controller for processing the acquired image data from the video data acquisition means, a controller to determine the movements of the test handler based on the data from the input/output means and from the video data controller, and a device transfer mechanism driver to drive the device transfer mechanism on the basis of the data from the controller.

According to the present invention, since the input data for indicating the types of IC device and device trays and their accurate position thereof are automatically acquired, human errors involved in changing the IC devices or device trays can be effectively eliminated. Therefore, reliability and operability of the test handler is increased as well as the increase in the test accuracy and efficiency.

DETAILED DESCRIPTION OF THE PREFERRED EMBODIMENTS

The embodiment of the present invention is explained with reference to FIGS. 1–5.

Figure 1:
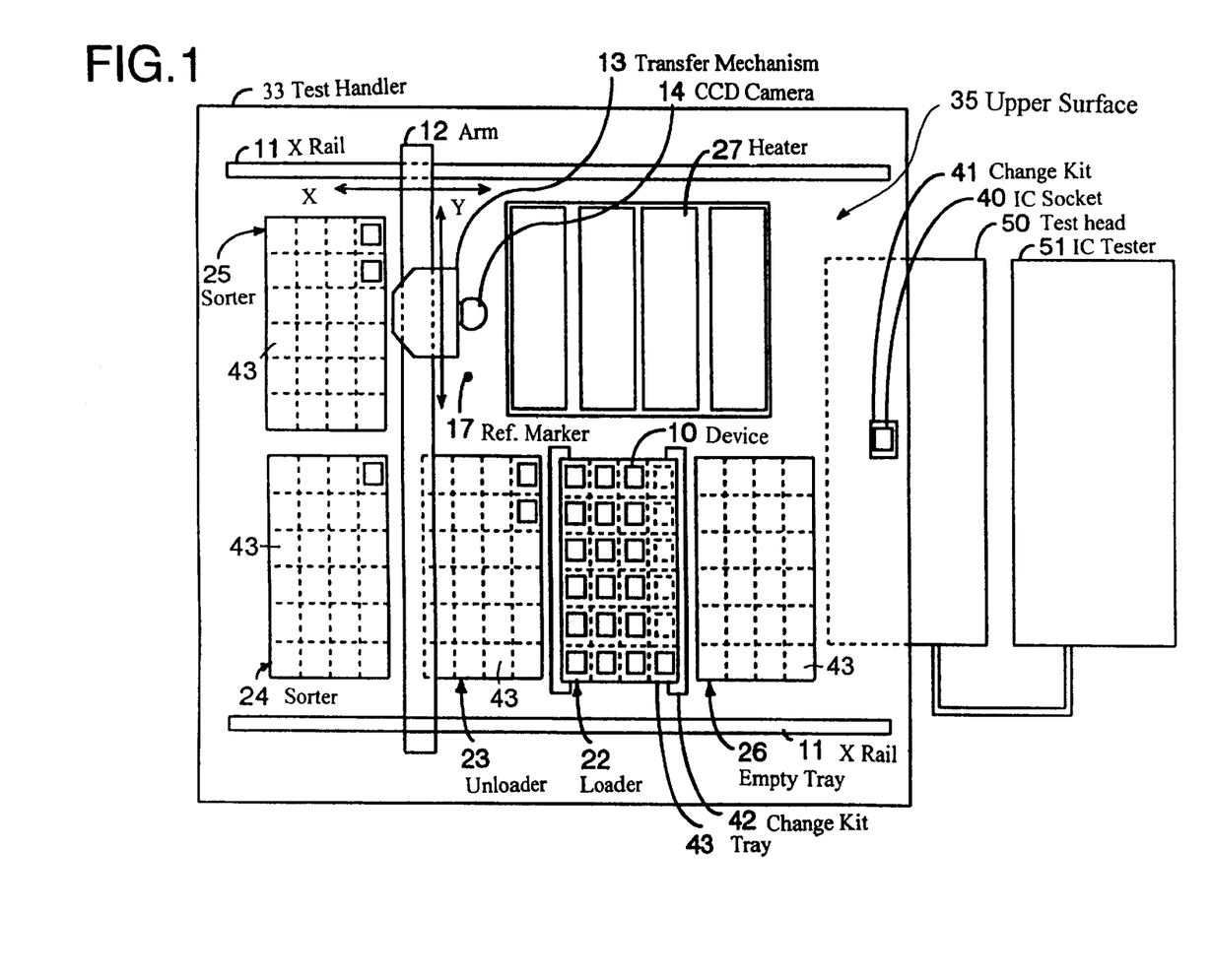
FIG. 1 is a plan view showing the horizontal transfer test handler of the present invention in combination with the IC tester and the test head.

As shown in FIG. 1, a horizontal transfer test handler 33 of the present invention is comprised of a device transfer mechanism 13 to pick, transfer, and place IC devices 10, a mobile arm 12 to allow movements of the device transfer mechanism 13 in a Y direction, an X direction rail to allow movements of the mobile arm 12 in an X direction, all of which are provided on an upper surface 35 of the test handler 33. The device transfer mechanism 13 includes a suction pad 16 that performs suction (pick) and suction release (place) operations for the IC devices 10 stored on a device tray 43. The suction force is created, for example, by a negative pressure such as vacuum. A suction arm 15 allows movements of the suction pad 16 in a Z direction (updown direction).

The horizontal transfer test handler 33 further includes a loader area 22 for loading a device tray 43 having a plurality of IC devices 10 to be tested, an unloader area 23 for receiving the IC devices 10 that have passed the test on a device tray 43, sorting areas 24 and 25 for receiving the tested IC devices 10 that have failed in the test on the respective device trays 43, a heater area 27 for applying heat to the IC devices 10 so that the test is performed under the high temperature environment, an empty tray area 26 for placing a device tray 43 emptied in the loader area 22, change kits 41 and 42 for accommodating different sizes and types of device trays and IC sockets, a CCD camera 14 for acquiring video data, and a reference position marker 17. Therefore, the test handler of the present invention additionally includes the CCD camera 14 and the reference marker 17 to the conventional example of FIGS. 5–8.

Figure 2:
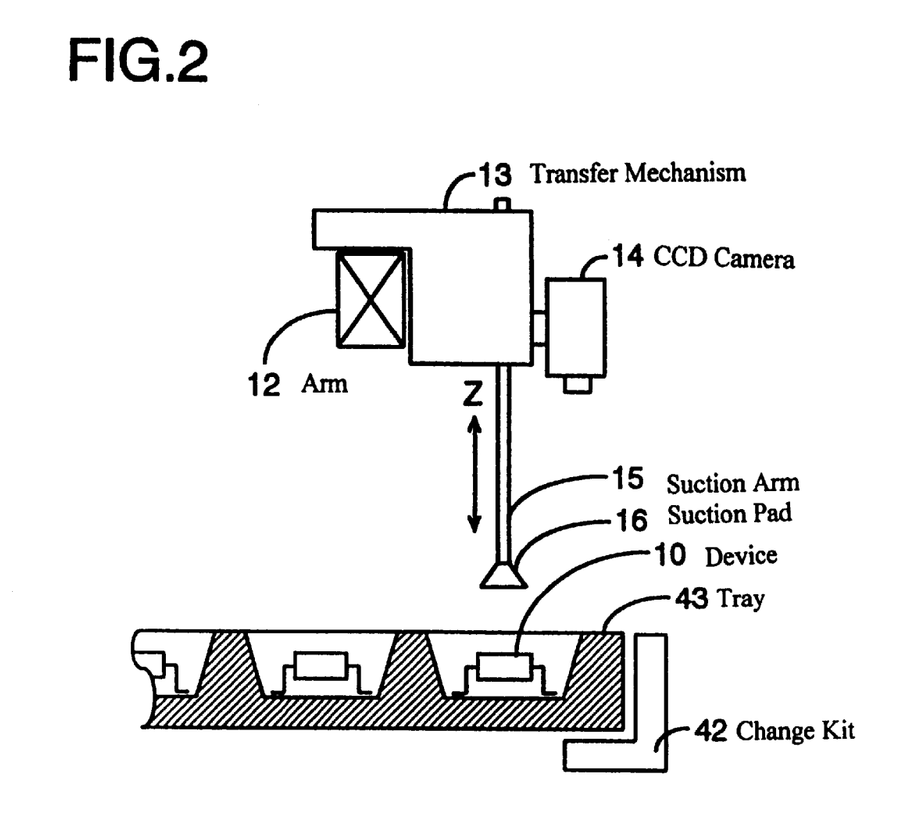
FIG. 2 is a schematic diagram showing a side view of the device transfer mechanism and a cross sectional view of the device tray of the present invention.

As shown in FIGS. 1 and 2, the CCD camera 14 is attached to the device transfer mechanism 13 which is driven in the X and Y directions. Preferably, the CCD camera 14 is positioned right above the suction arm 15 to acquire accurate image (video) data close to the suction pad 16. The reference position marker 17 is provided at an arbitrary position on the horizontal (upper) surface 35 of the test handler 33.

Figure 3:
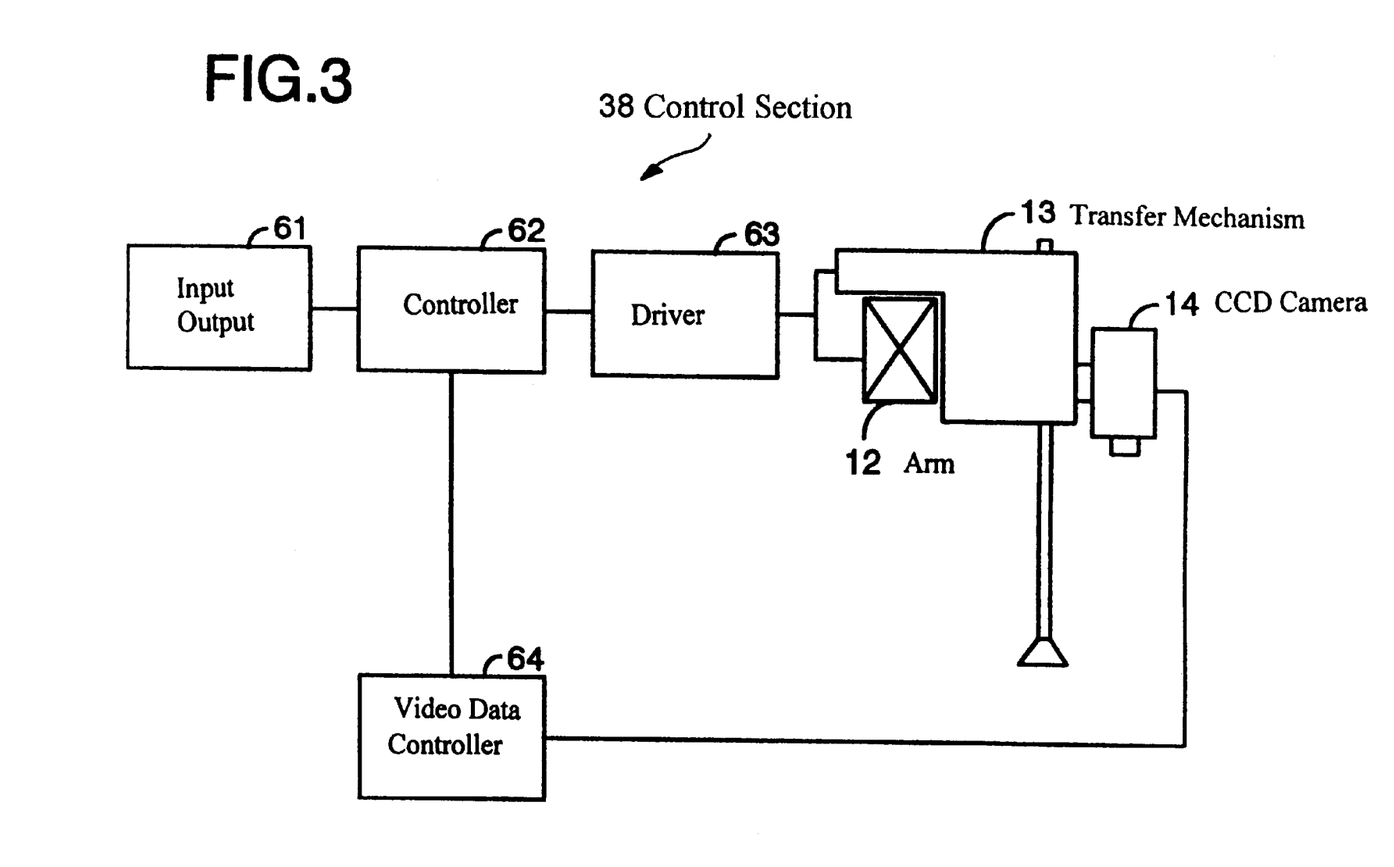
FIG. 3 is a schematic diagram showing a control section of the horizontal transfer test handler of the present invention.

FIG. 3 is a schematic diagram showing a control section 38 of the horizontal transfer test handler 33. The control section 38 is comprised of an input/output means 61 for receiving a control program and input data and generating test information or other test results, a controller 62 that interprets and executes the control program and input data, a device transfer mechanism driver 63 controlled by the controller 62, a video data controller 64 for receiving the video data from the CCD camera 14 and processing the video data to be applied to the controller 62.

Based on the drive signals from the driver 63, the device transfer mechanism 13 is moved in the X, Y, and Z directions. Namely, a pulse motor is controlled to drive the suction arm 15 in the Z direction. The mobile arm 12 is driven in the X direction and the device transfer mechanism 13 is driven in the Y direction, respectively, by the drive signals from the driver 63.

Figure 4:
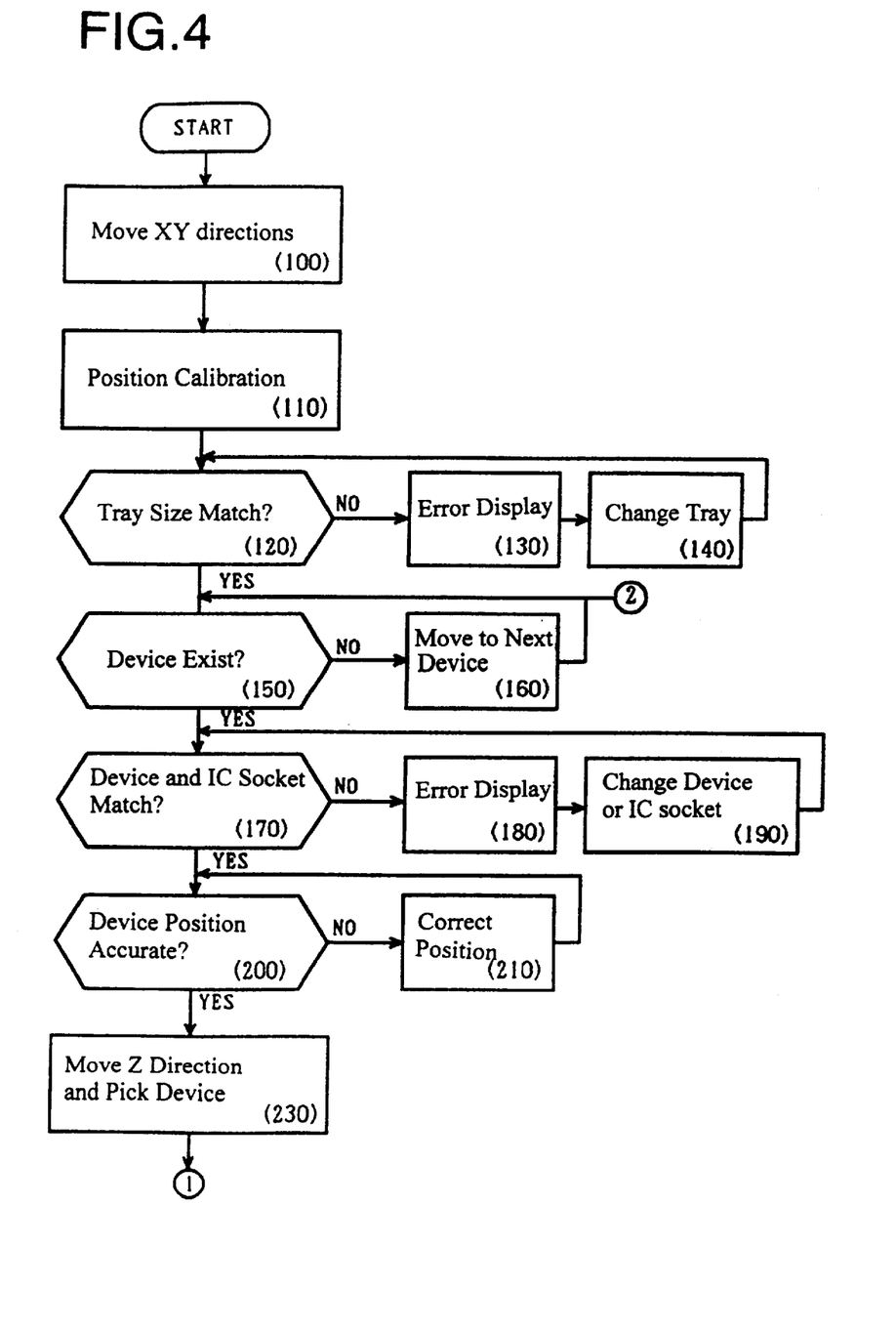
FIG. 4 is a flow chart showing a first part of the operation in the horizontal transfer test handler of the present invention.
Figure 5:
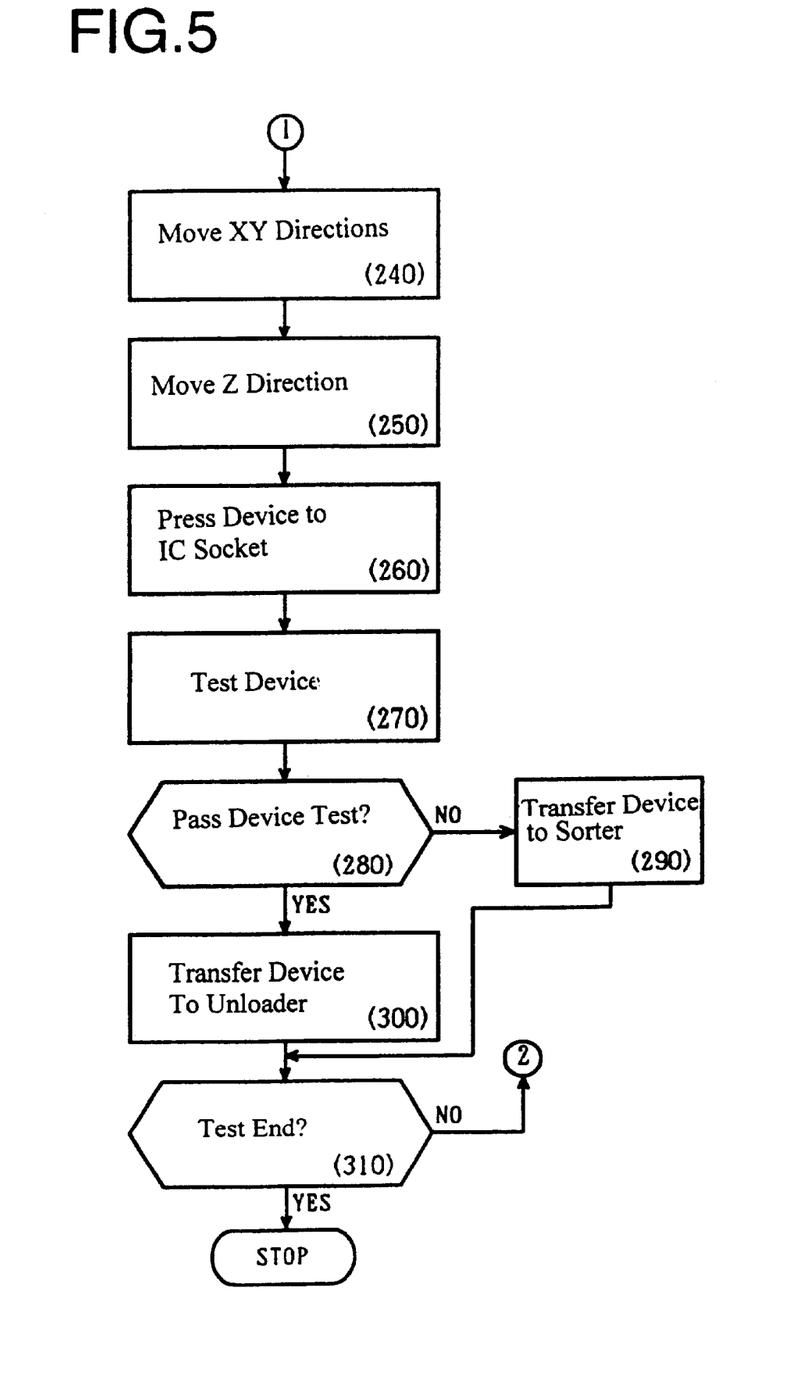
FIG. 5 is a flow chart showing a second part of the operation in the horizontal transfer test handler of the present invention.

The operation of the horizontal transfer test handler of the present invention is explained with reference to the flow chart of FIGS. 4 and 5. FIG. 4 shows a first part of the operation while FIG. 5 shows a second part of the operation in the horizontal transfer test handler 33. The basic operation common to the conventional horizontal transfer test handler is not give here.

In the operational procedure of FIG. 4, after the start step, the device transfer mechanism 13 is moved in the X and Y directions in the step 100. During this movement, video data is acquired by the CCD camera 14. In the step 110, a calibration process is performed for determining the position of the IC socket 40 relative to the reference position marker 17. Such a calibration is made, for example, by determining a position of the center point of the IC socket 40 based on the positions of four corners of the socket 40 with reference to the position marker 17.

The process moves to the step 120 wherein it is determined whether the size of a device tray 43 represented in the video data matches the tray size defined in the test program. If the size of the device tray 43 on the test handler is different from the size in the test program, an error message is displayed on the input/output means 61 in the step 130. In such a case, an operator changes the device trays 43 on the test handler 33 to the ones having the correct size in the step 140.

When the size of the device tray 43 matches the data in the test program, the process advances to the step 150 wherein it is determined whether an IC device 10 exists on a seat of the device tray 43 on the loader area 22 in the step 150. When there is no IC device 10 on the seat in question, in the step 160, the device transfer mechanism 13 moves in the X and Y directions to another seat of the device tray 43 where the next IC device exists.

When the IC device 10 is found, it is determined whether the device type data in the video data matches the IC socket 40 on the test head 50 in the step 170. If the type of IC device and the type of the IC socket do not match one another, an error message is displayed on the input/output means 61 in the step 180. In such a situation, the operator changes either type of IC devices to be tested or the IC socket in the step 190.

When the type of the IC device 10 and the IC socket 40 agree with each other, in the step 200, the position of the center of the IC device 10 is determined based on the positional data showing the four corners of the IC device 10 and the position of the device transfer mechanism 13 is corrected accordingly in the step 210. Then, the device transfer mechanism 13 moves downward and picks the IC device 10 by the suction force through the suction pad 16 and lifts the IC device 10 in the step 230.

As shown in the flow chart of FIG. 5, in the step 240, the device transfer mechanism 13 having the IC device 10 moves in the X and Y directions toward the IC socket 40 via the heater area 27. The suction arm 15 moves downward in the Z direction in the step 250 on the IC socket 40. In the step 260, the suction arm 15 further goes down to press the lead pins of the IC device 10 to the contact terminals of the IC socket 40 to establish electric connections therebetween.

In the step 270, the IC tester supplies test signals through the IC socket to the IC device 10 and evaluates the resultant signals from the IC device 10. In the step 280, the tester determines the pass/fail of the IC device. If the IC devices 10 are deemed be defective, the IC devices 10 are sorted to device trays 43 on the sort area 24 or 25 based on the cause of the failure where the devices are released from the suction pad 16 in the step 290. Then, the process is moved to the step 310 wherein it is determined whether the test should end.

If the IC device 10 is deemed good, it is transferred to a device tray on the unloader area 23 and is released from the suction pad 16 in the step 300. Then, in the step 310, it is determined whether the test should continue. When the test should continue, the process returns to the step 150 to undergo all the process steps described above. If it is determined that the test should end, the process stops.

Although not shown in the flow chart, the device tray 43 that is empty since all of the IC devices 10 are picked therefrom is transferred to the empty tray area 26 on the horizontal transfer test handler 33.

As noted above, the type, existence, location of the IC devices, and recognition of the tray shape are performed by the video data acquisition process in the above. Thus, the data input by the manual process is decreased. Consequently, reliability and operability of the test handler is increased due to the automatic data setting and the automatic positioning in replacing the change kits as well as to the automatic video data acquisition.

Although, the CCD camera 14 is used in the above example as a video data acquisition means, other means such as a digital camera or other video input means can be used so long as electric data representing a video image can be obtained therefrom. If brightness and contrast of the video input data are insufficient, a lighting means can be installed to the video data acquisition means to ease the procedure of acquiring the video data.

As has been in the foregoing, according to the horizontal transfer test handler of the present invention, since the input data for indicating the types of IC device and device trays and their accurate position thereof are automatically acquired, human errors involved in changing the IC devices or device trays can be effectively eliminated. Therefore, reliability and operability of the test handler is increased as well as the increase in test accuracy and efficiency.

What is claimed is:

1. A method of transferring IC devices in horizontal directions to and from a test head on a test handler having a device tray for carrying a plurality of IC devices to be tested, an IC socket mounted on the test head to interface between the IC device under test and an IC tester by establishing electrical connections therebetween, and a reference position marker provided on a horizontal surface of the test handler, comprising the following steps of:

supplying input data regarding types of IC devices to be tested and data regarding device trays to carry the IC devices to be tested to the test handler;

moving a device transfer mechanism for picking, transferring, and placing the IC devices in horizontal and vertical directions on the horizontal surface of the test handler, said device transfer mechanism having a video data acquisition means;

acquiring video data indicating an image shown at each location on the horizontal surface of the test handler through the video data acquisition means by changing positions over the horizontal surface in accordance with the movement of the device transfer mechanism;

processing video data on the image of the horizontal surface of the test handler including said IC socket and performing a positional calibration process by comparing data representing a center of said IC socket and said reference position marker to produce a correction factor;

processing the video data to determine a size of the device tray and judging whether the size of the IC tray matches tray size data in said input data; processing the video data to determine whether said IC socket on the horizontal surface of the test handler matches the IC device type data;

correcting a center position of said IC device under test by changing a position of said device transfer mechanism based on said correction factor; and moving the device transfer mechanism between the device tray and the IC socket for picking, transferring, and placing the IC devices in horizontal and vertical directions on the horizontal surface of the test handler for testing the IC devices.

2. A method of transferring IC devices as defined in claim 1, wherein said step of judging the size of the device tray derived from the video data with reference to the input data includes a step of displaying an error message when the device tray size does not match the input data regarding the device tray, and wherein said step of judging the IC socket type derived from the video data with reference to the input data includes a step of displaying an error message when the IC socket does not match the type of IC devices to be tested.

3. A method of transferring IC devices as defined in claim 1, further including a step of determining whether an IC device exists on the device tray, and when no IC device is found, moving the device transfer mechanism to another location over horizontal surface of the test handler where another IC device is positioned.

4. A method of transferring IC devices as defined in claim 1, wherein said step of moving the device transfer mechanism for testing the IC devices includes controlling steps of:

moving the device transfer mechanism downward for picking the IC device by a suction force;

moving the device transfer mechanism having the IC device in X and Y directions over the horizontal surface of the test handler toward the IC socket;

moving the device transfer mechanism downward over the IC socket and pressing lead pins of the IC device to contact terminals of the IC socket to establish electric connections therebetween;

supplying test signals through the IC socket to the IC device and evaluating the resultant signals from the IC device;

determining pass or fail of the IC device based on the evaluation of the resultant signals;

sorting the IC devices that have failed based on types of failure on device trays and loading the IC devices that have passed on a device tray in an unloader area of the test handler;

repeating the above controlling steps until all of the IC devices are evaluated.

5. A method of transferring IC devices as defined in claim 1, wherein said step of acquiring video data through said video data acquisition means including the step of using a CCD camera to obtain information including the type of IC device under test, existence of the IC device on the device tray, the type of device tray, the positions of the IC device and the IC socket.

6. A method of transferring IC devices as defined in claim 1, wherein said step of moving the device transfer mechanism for picking, transferring, and placing the IC devices is performed by a mobile arm mounting the device transfer mechanism thereon to allow movements of the device transfer mechanism in a front and rear direction over the horizontal surface of the test handler and a rail mounting the mobile arm thereon to allow movements of the mobile arm in a right and left direction over the horizontal surface of the test handler.

7. A method of transferring IC devices as defined in claim 1, wherein said step of moving the device transfer mechanism for picking, transferring, and placing the IC devices is conducted by a suction arm that performs suction and suction release operations for the IC devices on the device tray wherein the suction force is created by vacuum.

8. A method of transferring IC devices as defined in claim 4, wherein said controlling steps further includes a step of loading the device trays having the plurality of IC devices to be tested on the horizontal surface of the test handler.

9. A method of transferring IC devices as defined in claim 4, wherein said controlling steps further includes a step of applying heat to the IC devices to be tested so that the IC devices are tested under high temperature environment.

* * * * *